US006689264B1

(12) United States Patent
Belisle et al.

(10) Patent No.: US 6,689,264 B1
(45) Date of Patent: *Feb. 10, 2004

(54) SEMICONDUCTOR WAFER CLAMP RETAINER

(75) Inventors: Charles I. Belisle, Austin, TX (US); Michael L. Stephan, Pflugerville, TX (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/923,103

(22) Filed: Sep. 4, 1997

(51) Int. Cl.$^7$ .......................... C23C 14/34; B05C 13/00; C23F 1/00
(52) U.S. Cl. ............................ 204/298.15; 156/345.51; 118/500; 118/503; 118/728
(58) Field of Search ....................... 204/298.15, 298.14; 156/345; 118/728, 500, 503, 504, 505; 411/338, 339, 508, 509, 913, 433, 437, 361

(56) References Cited

U.S. PATENT DOCUMENTS

| 3,367,228 A | * | 2/1968 | King, Jr. et al. ............ 411/361 |
|---|---|---|---|
| 4,016,703 A | * | 4/1977 | Champoux et al. .......... 411/361 |
| 4,086,870 A | * | 5/1978 | Canavello et al. ........... 118/503 |
| 5,092,729 A | * | 3/1992 | Yamazaki et al. ...... 204/298.15 |
| 5,421,401 A | | 6/1995 | Sherstinsky et al. |
| 5,584,631 A | * | 12/1996 | Krumme et al. ............. 411/339 |
| 5,672,036 A | * | 9/1997 | Medal .......................... 411/82 |

\* cited by examiner

*Primary Examiner*—Patrick Ryan
*Assistant Examiner*—Gregg Cantelmo
(74) *Attorney, Agent, or Firm*—Kevin L. Daffer; Conley Rose P.C.

(57) ABSTRACT

An improved wafer clamp retainer is provided. The retainer is used to movably secure a wafer clamp to an upper electrode within a parallel-plate reactor. When drawn downward, the wafer clamp is pressed by the retainer against an outer periphery of the wafer to hold the wafer against the lower electrode. When drawn upward, the retainer lifts the wafer clamp from the wafer so that the wafer can be accessed. The wafer clamp retainer includes one or more features formed about an outer surface of a shaft extending from one end of the retainer body. The feature can comprise one or more rings, or spiral threads which mate with a flexible washer. The washer can be pushed directly upon the shaft and snap-fitted with the features or, alternatively, threaded upon the shaft by employing mating features on the wall which surrounds the opening through the washer. The combination of an improved retainer and improved washer minimizes possibility of breaking the retainer when performing periodic maintenance upon the wafer clamp.

22 Claims, 2 Drawing Sheets

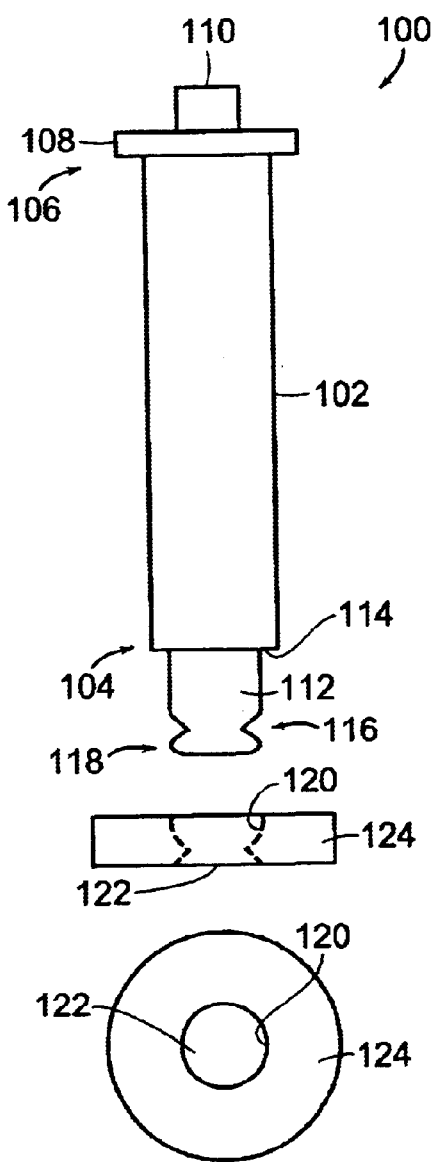
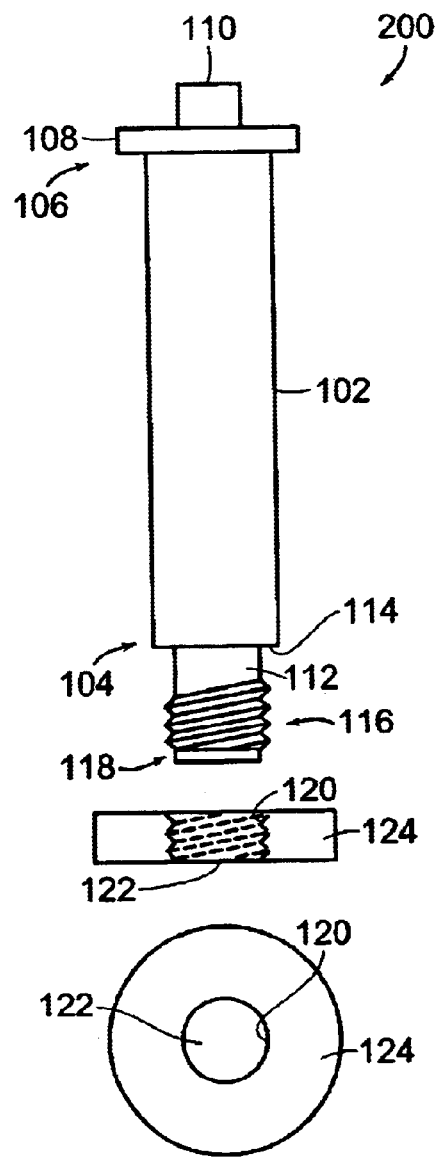
FIG. 2
FIG. 3

SEMICONDUCTOR WAFER CLAMP RETAINER

BACKGROUND OF THE INVENTION

1. Field of the Invention

This invention relates to fabricating a semiconductor wafer and, more particularly, to a retainer used for biasing a wafer clamp against a wafer during processing upon the wafer and for raising the clamp from the wafer after processing.

2. Description of the Related Art

A semiconductor wafer is classified as a monolithic substrate containing both conductive and non-conductive materials. Materials upon the wafer are selectively fashioned across the semiconductor wafer to form an integrated circuit. Each layer of material is patterned according to a technique generally known in the art, and henceforth described as "lithography".

A typical lithography process involves a sequence of steps beginning with a layer of material deposited entirely across the semiconductor wafer. Next, a photoresist (or resist) layer is spin-coated upon the deposited layer. The resist layer may be selectively radiated with, for example, ultraviolet light, electrons, or x-rays. An exposure tool, such as a mask, data tape (in electron beam lithography), etc., is used to selectively expose the resist. Patterns in the resist are formed when the wafer, and specifically the resist, undergoes a subsequent development step. Areas of resist remaining after development protect portions of the deposited layer. The resist which has been removed therefore exposes the underlying material to a variety of additive (e.g., lift-off) or subtractive (e.g., etching) processes that transfer a pattern from the exposure tool onto the conductive or non-conductive material.

There are numerous critical steps involved in accurately and reproducibly placing a pattern upon a semiconductor wafer. Certainly an important step in the expose-develop-etch sequence is the etch step. Accurate etching is of benefit to ensure materials are removed only where they are exposed. While offering high selectivity to only the material being removed, wet etching processing are typically isotropic. That is, wet etching generally attacks the material being removed with the same vigor in all directions. An unfortunate aspect of isotropic etching is undercutting. As film thicknesses decrease, and patterns being transferred become less than, e.g., 2.0 $\mu$m, it becomes difficult if not impossible to reliably use isotropic etching. Alternative pattern transfer processes are therefore needed to fabricate integrated circuits with such dimensions.

An alternative pattern transfer mechanism known as dry etching offers the capability of non-isotropic ("anisotropic") removal. Dry etching can involve either pure physical removal or a combination of both chemical and physical removal. A popular dry etch process involving both chemical and physical removal is the reactive ion etching ("RIE") or reactive ion beam etching ("RIBE") technique.

Dry etching utilizes a glow discharge of chemically reactive species (atoms, radicals and ions) from a relatively inert molecular gas. The glow discharge region occurs by biasing a pair of electrodes separated from one another. Typically, one electrode is coupled either to a DC or RF source, while the electrode is typically grounded. The chemically reactive species within the glow discharge react with the material to be etched, leaving a reaction byproduct which is volatile and thereby readily evacuated from between the parallel spaced electrodes. In addition, energetic ions occur within the glow discharge. The ions are directed by the DC or RF field toward a wafer placed upon one of the electrodes arranged between the electrode pair. The energetic ions strike the wafer surface and ablate or sputter remove exposed material from that surface, wherein the exposed material is material residing beneath a space between patterned resist.

As the chemically reactive species adsorb onto the wafer surface, and as ions strike that surface, the surface is somewhat heated. Mechanisms have evolved to allow backside cooling of the wafer as the wafer is being etched on its frontside. Cooling can involve, for example, forwarding a cooling gas, such as helium, across the gap which exists between the wafer backside surface and a wafer pedestal to which the wafer is clamped. Flow of the cooling gas helps maintain a nearly constant temperature gradient across the semiconductor wafer surface during processing. Temperature uniformity is critical to assuring process reproducibility and achieving consistent processing results.

Typical wafer clamps extend across the wafer frontside surface around the edge or periphery of the wafer to seal between the edge to the wafer pedestal. Proper amounts of downward force on the wafer clamp toward the pedestal minimizes or prevents leakage of cooling gas from the wafer backside, through the edge/pedestal gap and into the wafer processing environment. This helps eliminate or significantly mitigate cooling gas interference with critical glow discharge parameters and chemistry.

FIG. 1 illustrates one example of a typical processing tool 10 which can initiate and sustain dry etching and, preferably, ion-assisted etching such as RIE and RIBE. Tool 10 includes a reaction chamber 12 adapted to receive incoming gas 14 through an inlet port. Gas 14 is used to bring about glow discharge during times when parallel-placed electrodes 16a and 16b are powered. Volatile byproducts 18 can be evacuated from the glow discharge area by an outlet port, as shown.

Lower electrode 16b is considered a wafer pedestal in that it accommodates a wafer 20 placed thereon. Various apertures may exist within electrode 16b to allow cooling gas flow across the backside surface of wafer 20. To ensure wafer 20 is sealed against electrode 16b, a wafer clamp, configured similar to a ring, is designed to abut against the upper surface of wafer 20 about the wafer perimeter. Clamp 22 is retained in a movable, biased position relative to upper electrode 16a so that when upper electrode 16a moves, so will clamp 22 to some extent.

FIG. 1 illustrates wafer clamp 22 retained upward away from wafer 20 to allow ingress to wafer 20 during loading and unloading of the wafer into chamber 12. During processing, the gap between electrodes 16a and 16b diminishes, and clamp 22 is forced downward upon the perimeter of wafer 20. Clamp 22 is retained using clamp retainers 24.

FIG. 2 illustrates one example of portions of a dry etch mechanism, a suitable mechanism being that obtainable from LAM Research Corp., model no. 4720, 4600, 9600, etc. The portions shown in FIG. 2 comprise a ring 28 configurable within an upper electrode 16a (shown in FIG. 1). Ring 28 is secured using various attaching devices, or screws 30. Coupled to the underside surface of ring 28 may be a non-reactive plate 32. Plate 32 serves to cover ring 28 and various reactive materials within ring 28 as well as upper electrode 16a. Plate 32 preferably comprises a material which does not react to the glow discharge material between the electrodes, or the gas species 14 introduced into the chamber. According to a metal etch example, plate 32 may comprise a quartz or ceramic material which is substantially inert to metal etchants delivered into the chamber.

Coupled a biased distanced below plate 32 and ring 28 is wafer clamp 22. Wafer clamp 22 appears somewhat like a ring or flat washer having a downward extending flange or lip 34. Lip 34 abuts with the upper surface at the perimeter of a wafer 20. Regions radially outside lip 34 accommodate various apertures 36 circumferentially placed about clamp 22.

Apertures 36 within clamp 22, along with apertures 38 within plate 32, accommodate passage of a retainer 24. A sleeve 40 may be inserted into aperture 36 between the inward facing wall of aperture 36 and retainer 24 to prevent friction between the rigid plate 32 and the rigid material of retainer 24. Preferably, sleeve 40 is made of a Teflon® substance.

Once sleeve 40 is in place, retainer 24 extends through aperture 38, through washer 42, through aperture 36, and finally through washer 44. Configured on a shaft at one end of retainer 24 is a pair of regularly extending tabs 46. Tabs 46 extend radially outward, yet are smaller than the inside diameter of sleeve 40 and aperture 36. Tabs 46 are designed to fit through the keyhole openings 50 of washers 42 and 44. One-quarter rotation of retainer 24 relative to washer 44 allows retainer 24 to retain or "hold" clamp 22 a biased distance below upper electrode 16a (shown in FIG. 1). Biasing force upon clamp 22 occurs via a spring 54 which extends between the upper surface of retainer 24 and a cutout within ring 28. When upper electrode 16a is drawn upward, a lip near the upper regions of retainer 24 secures retainer 24 within the recess of ring 28, and washer 44 secures clamp 22 to retainer 28 a spaced distance below plate 32 proportional to the length of retainer 24. However, when the upper electrode moves downward to a processing position, clamp 22 extends about wafer 20, and is biased in the clamping position by spring 54. Further details as to the configuration of retainer 24 is best illustrated in a detailed, cross-sectional view provided in FIG. 3.

FIG. 3 depicts retainer 24 shown biased downward by spring 54. Wafer clamp 22 is retained in position between washers 42 and 44. Tabs 46 are rotated relative to the keyhole openings within the lower washer 44 so that the washer will not fall from its retained position.

Washers 42 and 44 maintain a fixed position between clamp 22 and retainer 24. As the upper electrode moves downward toward the lower electrode, retainer 24 also moves downward along with clamp 22. Downward clamping force can be provided, in part, by spring 54. When the upper electrode moves upward from the lower electrode, retainer 24 moves with the upper electrode, as does wafer clamp 22.

FIG. 4 illustrates in more detail the various aspects of retainer 24 and washer 44 placeable on one end of retainer 24. Formed at one end of retainer is a shaft terminated into a pair of radially extending tabs 46. The tabs are dimensioned smaller than a keyhole opening 50 within washer 44. Keyhole opening 50 is shown as substantially circular, except for two radially extending cutouts 58a and 58b. Cutouts 58a and 58b receive tabs 46, and the circular portion of keyhole 50 receives shaft 56. Two small indents or recesses 60a and 60b exit near keyhole 50 to retain tabs 46 after they are rotated one quarter turn from the insertion cutouts 58. Cutouts or recesses 60 are preferably into only the downward-facing surface of washer 44 as shown.

Tabs 46 are relatively small in order to fit through apertures and/or keyholes less than one half inch in diameter, for example. In some instances of, for example, a LAM Research, Corp. dry etcher such as a model Rainbow tungsten etcher, tabs 46 extend less than one eighth inch from the outer surface of the shaft. The relatively small tabs are, unfortunately, highly susceptible to breakage at the point in which they connect to the outer surface. The quartz or ceramic wafer clamp 22 is generally quite heavy and is supported almost entirely by tabs 46 when the upper electrode is moved to "home" position to allow wafer loading and unloading. Periodically, the wafer clamp must be cleaned, or removed and replaced with another wafer clamp. To remove wafer clamp 22 from retainers 24, washer 44 is rotated so that protrusions 58a and 58b align with tabs 46. This allows washer 44 to be removed, along with clamp 22 from shaft 56 of retainer 24. Any misalignment of tabs 46 to the apertures 36 within clamp 22 will cause tabs 46 to break when drawn through aperture 36.

Wafer clamp 22 must periodically be removed for cleaning. The clamp is typically made from quartz or ceramic and can be quite heavy as compared to the strength of the portions of retainers 24 used to hold clamp 22. Removal and replacement of clamp 22 can therefore result in breakage of one or more of retainers 24. When used in a metal etcher, retainer 24 is typically made of ceramic or quartz which is known to be somewhat expensive. For example, an average cost of one ceramic retainer 24 is between $150.00 to approximately $350.00. There are generally several retainers which extend through apertures within clamp 22. According to several designs, approximately six retainers 24 are needed to retain the wafer clamp. If occurs on one retainer, typically breakage occurs on all six, leaving a total cost of between $900.00 to over $2,000.00 during each maintenance cycle on the wafer clamp. It is estimated that the wafer clamp must be cleaned or replaced after as few as 20 wafer runs upward to several hundred wafer runs. Thus, the cost of replacing the retainers translated to each wafer being processed can be quite significant.

It is therefore desirable to derive a wafer clamp retainer which is not susceptible to breakage during routine maintenance. It is further desirable to design a retainer which can be easily manufactured at a relatively low cost.

SUMMARY OF THE INVENTION

The problems outlined above are in large part solved by an improved wafer clamp retainer hereof The retainer avoids radially extending tabs as may exist in conventional designs, and therefore avoids the problems of breakage associated with the placement of those tabs relative to the retainer shaft. The present retainer includes a shaft at one end of the retainer, and a feature formed about the shaft which is altogether dissimilar from tabs in both structure and function. The feature preferably extends around the entire shaft circumference, and is formed so that it cannot e easily broken or dislodged from the shaft. Thus, instead of having, e.g., two radially extending tabs limited to two localized areas at the end of the shaft, the presently defined feature exists on the outer surface of the shaft between the end of the shaft and the opposing end of the retainer. The feature is therefore spaced from the shaft end where rigidity is suspect. The feature is defined as any indent or protrusion which extends as a ring or spiral about the outer)surface of the shaft.

Designed to be mated with the feature upon the shaft, is an improved washer design. Instead of the washer being conventionally rigid, the present washer is flexible. Specifically, the present washer includes an opening extending entirely through the washer. The opening can be re-shaped when the washer is flexed so that the opening can extend over a shaft outer surface which is larger than the unflexed opening. A flexible washer thereby provides a radially inward biasing force of the opening walls against the shaft outer surface. The amount of bias is dictated by the difference in size between the shaft and an unflexed opening. Preferably, the difference is designed so that, in addition to mating of the features, the opening walls securely affix to the shaft outer surface until time comes when an operator can forcibly remove the washer from the shaft. It is desirous that the combination of improved retainer and washer allows secure coupling and discoupling therebetween but without risk of breaking the retainer and/or washer during routine maintenace.

According to one exemplary embodiment, the feature is an indent or protrusion extending as a ring about the shaft outer surface. The indent or protrusion is spaced from the end of the shaft so that sufficient surface area exists above and below the ring to enhance its strength with respect to the shaft. It is believed that if the feature was placed at the end of the shaft similar to tabs in conventional designs, the feature would be more susceptible to breakage from that end.

According to another exemplary embodiment, the feature is an indent or protrusion extending as a spiral, or "thread". The thread, or threads, extend a spaced distance from the end of the shaft upward along the shaft outer surface toward the opposing end of the retainer.

Regardless of the feature configuration, a mating washer is provided. The washer contains a counterpart feature which mates with the singular or multiple rings, or threads upon the shaft. The features within the washer are confined to the inward facing wall which surrounds the washer opening. Those features enhance the retention force of the washer upon the shaft so that the retainer or retainers can lift a substantially heavy wafer clamp.

BRIEF DESCRIPTION OF THE DRAWINGS

Other objects and advantages of the invention will become apparent upon reading the following detailed description and upon reference to the accompanying drawings in which:

FIG. 2 is a side elevational view of a clamp retainer according to one embodiment of the present invention, wherein the clamp retainer comprises an indent formed about a shaft at one end of the clamp for insertion into an opening within a flexible washer to mate with a protrusion extending radially inward from the wall which encircles the opening; and FIG. 3 is a side elevational view of a clamp retainer according to another embodiment of the present invention, wherein the clamp retainer comprises threads formed about a shaft at one end of the clamp for rotatable insertion into a threaded opening within a flexible washer.

Figure 1:
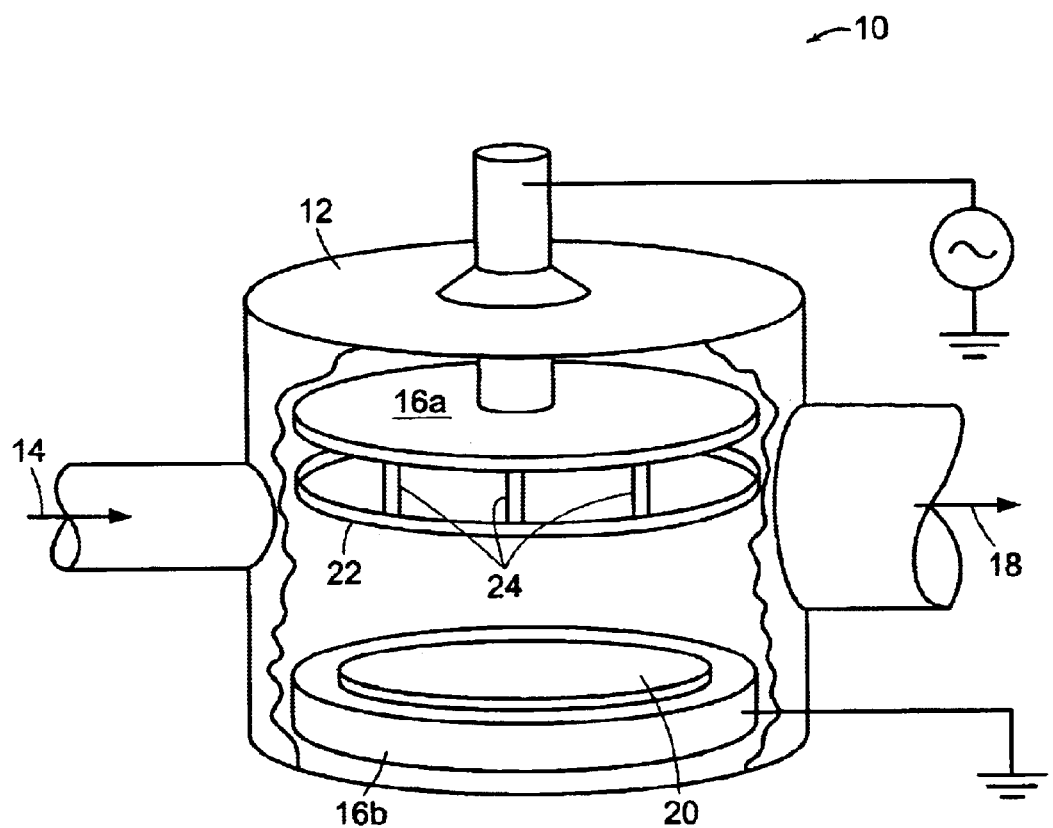
FIG. 1 is perspective view in partial breakaway of a processing tool containing parallel electrodes used to process a semiconductor wafer.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 2 is a side elevational view of a clamp retainer 100 according to one embodiment of the present invention. Retainer 100 comprises a cylindrical body 102 which extends along an axis between a first end 104 and a second end 106. The second end terminates into a flange 108 and a spring guide 110. Flange 108 and spring guide 110 can be formed from a singular, unibody construction along with body 102. Flange 108 helps prevent movement of retainer 100 through an opening arranged within a ring configured within upper electrode 16a (shown in FIG. 1). Spring guide 110 helps guide a spring between the ring and flange 108. Coupled to or extending from first end 104 is shaft 112. Shaft 112 is preferably smaller in radial dimension than body 102, to present a lip 114 at first end 104.

Extending about the outer surface of shaft 112 is at least one feature 116. Feature 116 is present a spaced distance from shaft end 118, between shaft end 118 and first end 104. Merely as an example, feature 116 comprises a ring etched into or extending above the surface of shaft 112. The ring extends concentrically around shaft 112. The ring can either be an indent or protrusion, or an indent seated with a material of composition altogether dissimilar from the shaft extending radially from the indent above the outer surface of the shaft.

According to one form, body 102 length is approximately 1.0 to 1.5 inches, and more preferably 1.30 inches, and yet more preferably approximately 1.32 inches. Shaft 112 length is approximately 0.2 to 0.4 inches, and more preferably 0.3 inches. The length of spring guide 110 is approximately 0.1 inches, and more preferably approximately 0.103 inches. Lengths are dimensioned as measured along the elongated axis of retainer 100. The diameter of spring guide 110 (as measured perpendicular to the elongated axis) is within the range of 0.1 to 0.2 inches, and more preferably approximately 0.176 inches. The diameter of shaft 112 is within the range of 0.2 to 0.3, and more preferably approximately 0.229 inches. Flange 108 extends radially outward from shaft body 102, and is preferably a diameter of approximately 0.444 inches, while body 102 diameter is approximately 0.346 inches. The amount of radial recess into or protrusion from shaft 112 is approximately near, but possibly less than, 0.065 inches given the above dimensions. The protrusion and/or indents may come in the form of threads (shown in FIG. 3). Of course, the aforementioned dimensions are examples of one exemplary clamp retainer 100. It is recognized that a retainer can accommodate dissimilar dimensions depending on the opening through which it extends, or the wafer clamp and/or processing tool size, weight and dimensions into which the retainer is embodied.

To receive feature 116, a wall 120 which surrounds an opening 122 through washer 124 must be carefully designed. More particularly, wall 120 includes a protrusion extending radially inward or a recess extending radially outward to receive the indent or protrusion of, for example, feature 116. Washer 124 is made of any flexible material, a suitable material being Teflon®. A flexible washer affords re-configuration of opening 122 such that an opening which is normally smaller in diameter than shaft 122 can be stretched larger in diameter than shaft 122. Flexure allows frictional engagement as well as snap-fit engagement between shaft 112 and washer 124 with the features on wall 120 engaging with feature 116. This helps minimize movement of washer 124 along shaft 112, once coupled.

FIG. 3 illustrates an alternative embodiment. Numerous components of retainer 200 shown in FIG. 3 are similar to retainer 100 shown in FIG. 2. For sake of brevity and clarity in the drawings, components which are similar are given like reference numerals, and are not discussed further. However, components which are dissimilar, are given dissimilar reference numerals from that shown in FIG. 2, and will be discussed herein below.

The alternative retainer 200, like retainer 100, comprises body 102, first and second ends 104 and 106, flange 108, lip 114, spring guide 110, shaft 112, and shaft end 118. Feature 116 formed upon shaft 112 is, however, dissimilar in form and function than the feature shown in FIG. 2. Specifically, feature 116 of FIG. 3 can comprise protrusions or indents extending in a spiral patterned a spaced distance from shaft end 118. By purposefully beginning the spiral away from end 118, opportunity for chipping an indent/protrusion placed at the end is minimized. It is believed that protrusions and/or indents arranged away from end 118 are more rigid relative to the shaft than if they were placed at the end and, therefore, are less susceptible to breakage. Accordingly, present features 116 are defined well within the bounds of the shaft surface and extend entirely about the shaft surface instead of being localized in defined areas at the shaft end. The spiral configuration, or threads of feature 116 mate with spiral indents and/or protrusions arranged within washer 124. The spiral indents and/or protrusions extend along a wall radially inward and/or outward from the wall, referenced as numeral 120. Wall 120 defines a circular opening 122 through which shaft 112 rotatably extends. Again, washer 124 shown in FIG. 3 is a flexible washer made of, for example, Teflon®. A flexible washer can be flexed or biased so that the opening is enlarged during insertion of washer 124 upon shaft 112. However, after insertion, opening 120 attempts to return to its unflexed state. In so doing, wall 120 is biased against shaft 112 to maintain its securement thereon.

It will be appreciated to those skilled in the art having the benefit of this disclosure that this invention is believed applicable to any substrate prepared by one or more steps involving lithography and, more specifically, an etch process. The substrate includes, for example, a semiconductor wafer, but is not limited entirely to a semiconductor wafer. It is understood that the form of the invention shown is to be taken as exemplary, presently preferred embodiments. Regardless of the processing tool, reactor configuration, and/or application, the present invention is suited for an processing tool which employs a wafer clamp and, more specifically, a retainer for retaining the wafer clamp to an upper electrode of a reactor having the capability of applying power to that electrode. One, or more than one feature comprising indents or protrusions can be arranged about the shaft. If two or more features are used, one feature is preferably spaced from the other. A protruding or recessed ring encircling the shaft outer surface is desired to snap fit upon a washer containing a mating feature. Alternatively, the shaft and washer can be rotatably coupled if the protruding or recessed feature, or features, comprise threads possibly spaced from one another across the shaft outer surface. Accordingly, the specification and drawings are to be regarded in an illustrative rather than a restrictive sense as to the possibly numerous variations which fall within the scope of the present invention.

What is claimed is:

1. A wafer clamp assembly, comprising:
   a cylindrical body extending along an axis between opposed first and second ends;
   a shaft extending along the axis from the first end to a shaft end;
   a washer comprising an opening wall around an opening therein, and wherein a first feature is arranged around an inner surface of the opening wall; and
   a second feature arranged around an outer surface of the shaft, wherein the second feature is configured to mate with the first feature such that the opening wall of the washer is securely affixed to an outer surface of the shaft and movement of the washer along the shaft towards and away from the body is inhibited and such that the washer is removable from the shaft without breaking the washer or the shaft, the assembly being configured to retain a wafer clamp moveably secured to an electrode of a processing tool between the body and the washer after mating of the first and second features.

2. The wafer clamp retainer assembly as recited in claim 1, wherein the washer is flexible to allow the opening to expand to securely fit over the shaft, which is dimensioned larger than the opening in an unflexed state, and the opening wall extends continuously around the opening.

3. The wafer clamp retainer assembly as recited in claim 1, wherein said second feature comprises an indent which extends entirely around the circumference of the shaft.

4. The wafer clamp retainer assembly as recited in claim 3, wherein the indent extends back upon itself to form a recessed ring entirely around the circumference of the shaft.

5. The wafer clamp retainer assembly as recited in claim 3, wherein the indent is spaced between the first end and the shaft end such that surface area exists along the shaft between the indent and the shaft end.

6. The wafer clamp retainer assembly as recited in claim 3, wherein the first feature is confined to the opening wall and comprises a protrusion extending radially inward from the opening wall.

7. The wafer clamp retainer assembly as recited in claim 6, wherein the protrusion mates with said indent during times when the shaft is inserted into the washer, wherein the opening wall is configured to securely affix to the outer surface of the shaft when the protrusion is mated with the indent.

8. The wafer clamp retainer assembly as recited in claim 1, wherein the second feature comprises threads.

9. The wafer clamp retainer assembly as recited in claim 8, wherein the threads spiral about the circumference of the shaft at least partially between the first end and the shaft end, and wherein the threads are spaced from the shaft end such that surface area exists along the shaft between the threads and the shaft end.

10. The wafer clamp retainer assembly as recited in claim 8, wherein the first feature comprises threads extending radially inward from the opening wall.

11. The wafer clamp retainer assembly as recited in claim 8, wherein threads upon the shaft rotatably mate with threads upon the opening wall during times when the shaft is inserted into the washer.

12. The wafer clamp retainer assembly as recited in claim 1, wherein the shaft is dimensioned radially smaller than the cylindrical body to present a lip for retaining a wafer clamp between the lip and the washer.

13. The wafer clamp retainer assembly as recited in claim 1, further comprising a spring bias applied against the second end for directing, during use, a wafer clamp in a downward direction against a wafer.

14. The wafer clamp as recited in claim 1, wherein without breaking the washer or the shaft comprises without substantially damaging the washer or the shaft.

15. A system for retaining a wafer clamp to an electrode within a processing tool, comprising:
 a substantially cylindrical wafer clamp retainer having opposed first and second ends, wherein the first end is movably secured to the electrode;
 a washer comprising an opening wall around an opening therein, and wherein a first feature is arranged around an inner surface of the opening wall; and
 a second feature arranged around the circumference of the wafer clamp retainer proximate to the second end for mating with the first feature to secure a wafer clamp between the wafer clamp retainer and the washer such that the opening wall of the washer is securely affixed to an outer surface of the shaft and movement of the washer along the shaft towards and away from the body is inhibited and such that the washer is removable from the shaft without breaking the washer or the shaft.

16. The system as recited in claim 15, wherein said first and second features comprise indents and protrusions, respectively.

17. The system as recited in claim 15, wherein said first and second features comprise protrusions and indents, respectively.

18. The system as recited in claim 15, wherein said first and second features comprise threads.

19. The system as recited in claim 15, further comprising another electrode upon which a wafer is secured beneath a portion of said wafer clamp.

20. The system as recited in claim 19, wherein said electrode and said another electrode partially form said processing tool comprising a parallel-plate reactor.

21. The system as recited in claim 15, wherein said opening is smaller than the circumference of the wafer clamp proximate to the second end, and wherein said washer is flexible to allow extension of said opening larger than the circumference of the wafer clamp retainer proximate the second end.

22. The system as recited in claim 15, wherein without breaking the washer or the shaft comprises without substantially damaging the washer or the shaft.

* * * * *